(12) United States Patent
La Rosa

(10) Patent No.: US 6,563,344 B2
(45) Date of Patent: May 13, 2003

(54) BUFFER CIRCUIT FOR THE RECEPTION OF A CLOCK SIGNAL

(75) Inventor: Francesco La Rosa, Rousset (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 09/935,292

(22) Filed: Aug. 22, 2001

(65) Prior Publication Data

US 2002/0070757 A1 Jun. 13, 2002

(30) Foreign Application Priority Data

Aug. 23, 2000 (FR) ............................................. 00 10873

(51) Int. Cl.[7] ............................................. H03K 19/00
(52) U.S. Cl. ............................. 326/93; 326/21; 326/22; 326/26
(58) Field of Search ................................ 326/93, 94, 99, 326/21, 22, 23, 26, 27, 28; 365/189.01, 233

(56) References Cited

U.S. PATENT DOCUMENTS

| 5,168,181 A | * 12/1992 | Baiocchi et al. ............. 307/520 |
| 5,200,926 A | 4/1993 | Iwahashi et al. ........... 365/233.5 |
| 5,272,674 A | 12/1993 | Pathak et al. ................ 365/206 |
| 5,610,544 A | 3/1997 | Aoki ............................ 327/198 |
| 5,633,833 A | 5/1997 | Yoon ...................... 365/230.08 |
| 6,249,141 B1 | * 6/2001 | Aspacio et al. ................ 326/29 |
| 6,292,430 B1 | * 9/2001 | Ohtake et al. ............... 365/233 |

OTHER PUBLICATIONS

Patent Abstracts of Japan, vol. 1995, No. 10, Nov. 30, 1995 & JP07183787A (Nec Corp), Jul. 21, 1995.

* cited by examiner

Primary Examiner—Michael Tokar
Assistant Examiner—Anh Q. Tran
(74) Attorney, Agent, or Firm—Allen, Dyer, Doppelt, Milbrath & Gilchrist, P.A.; Lisa K. Jorgenson

(57) ABSTRACT

A buffer circuit includes an input for receiving a logic signal, and a transfer circuit for transferring the logic signal from the input to an output of the buffer circuit. The transfer circuit includes at least one logic gate having a trip point sensitive to a supply voltage of the buffer circuit. The buffer circuit further includes a delivery circuit for delivering an inhibit signal having a predetermined duration when the logic signal has a trailing edge and/or leading edge, and an inhibit circuit for inhibiting the transfer circuit and for isolating the output of the buffer circuit from the input of the buffer circuit when the inhibit signal is delivered. A storage circuit holds a logic value of the logic signal at the output of the buffer circuit when the inhibit signal is delivered.

23 Claims, 4 Drawing Sheets

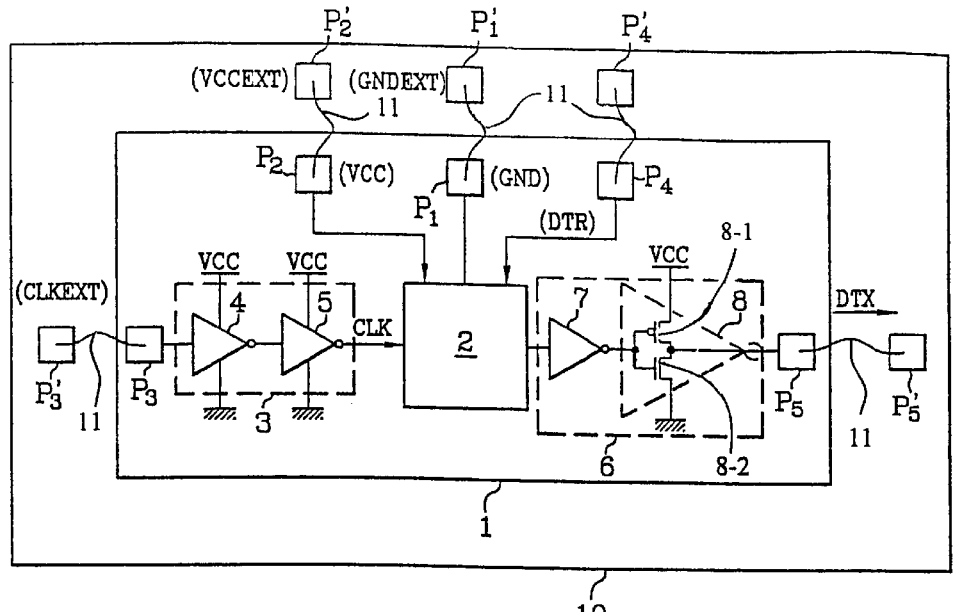
Fig. 1
(PRIOR ART)
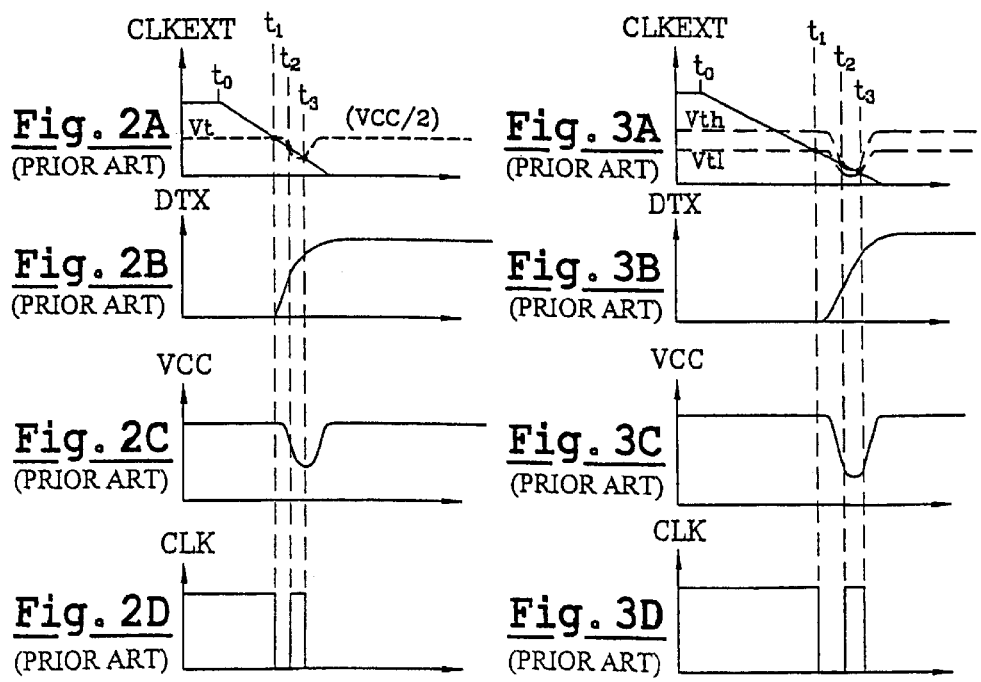

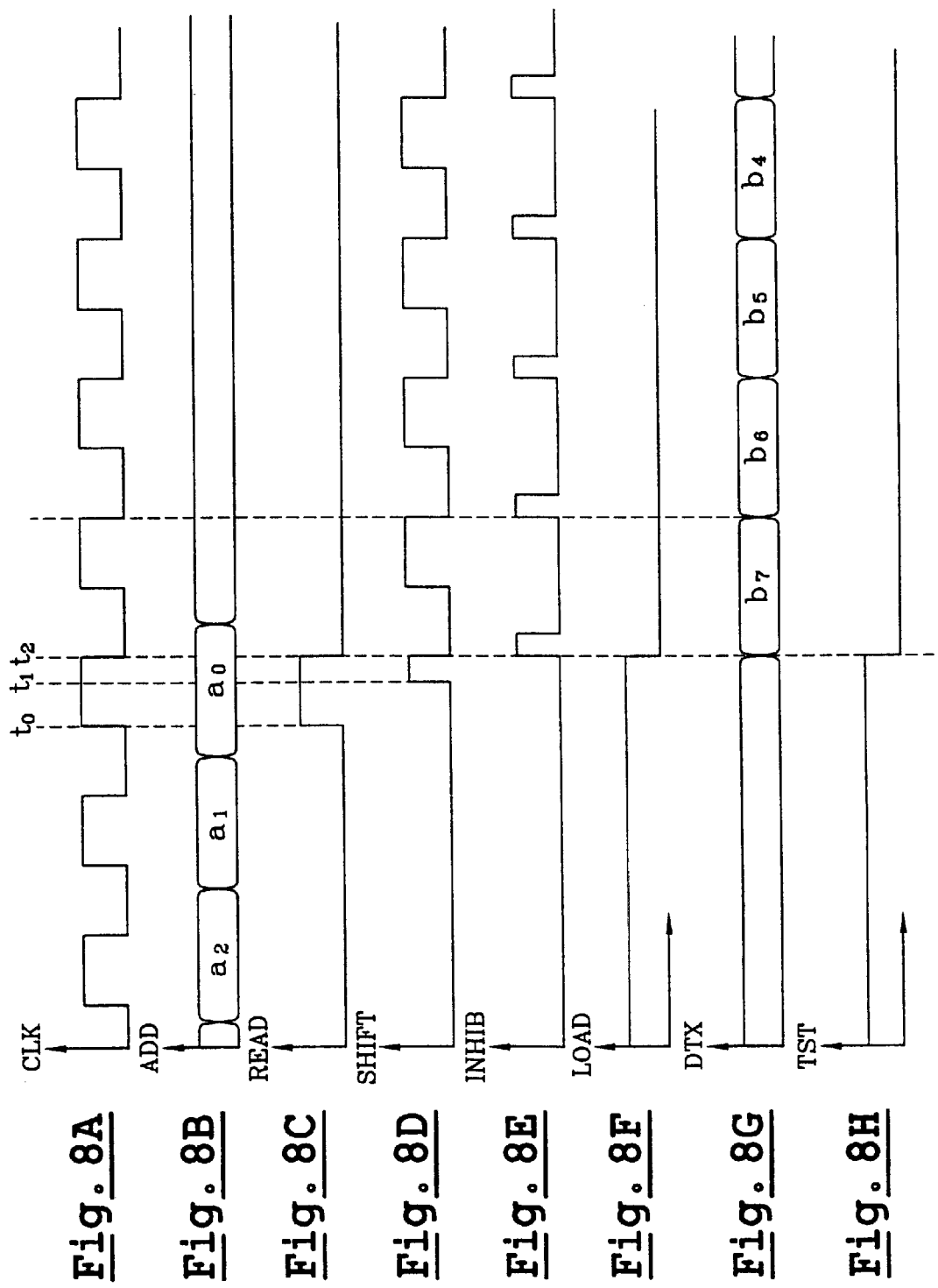

US 6,563,344 B2

BUFFER CIRCUIT FOR THE RECEPTION OF A CLOCK SIGNAL

FIELD OF THE INVENTION

The present invention relates to a buffer circuit with transfer means for transferring a logic signal received at its input to its output, with the transfer means comprising at least one logic gate having a trip point sensitive to the supply voltage of the buffer circuit.

BACKGROUND OF THE INVENTION

In integrated circuits, external logic signals are often received through buffer circuits that shape the signal. Such buffer circuits generally comprise logic gates having a trip point sensitive to the variations in the supply voltage applied to the integrated circuit. Certain operations sometimes prompt a substantial current draw in the output state of the integrated circuit leading to a temporary but significant drop in the supply voltage. A supply voltage drop of this kind leads to a drop in the tripping threshold of the buffer circuits. This drop gives rise to the transmission of erroneous signals, as will be understood more clearly by the following example.

FIG. 1 illustrates an integrated circuit 1 on an interconnection support 10. The integrated circuit 1 has contact zones P1 to P5 connected to zones P1' to P5' of the support 10 by ultrasonically soldered metal wires 11. The zone P1 receives a ground potential GND, the zone P2 receives the supply voltage VCC, the zone P3 receives an external clock signal CLKEXT, the zone P3 is designed to receive data DTR, and the zone P5 is designed to send data DTX.

Due to the resistivity of the wires 11 and their parasitic inductance, the ground potential GND present at the zone P1, under the conditions described below, may be different from the external ground potential GNDEXT present at the zone P1'. Similarly, the supply voltage VCC received at the zone P2 may be different from the external supply voltage VCCEXT present at the zone P2'.

The external clock signal CLKEXT received at the zone P3 is applied to the core 2 of the integrated circuit (represented schematically by a block) by a buffer circuit 3 comprising two cascade-connected inverter gates 4, 5 whose output delivers an internal clock signal CLK that copies the variations of the external clock signal CLKEXT.

The data DTX sent by the core 2 of the integrated circuit are delivered to the zone P5 by an output buffer 6 comprising two cascade-connected inverter gates 7, 8. The output inverter gate 8 comprises a large-sized pull-up transistor 8-1 capable of delivering high current when sending a 1 in the presence of a highly capacitive load. Similarly, the gate 8 comprises a large-sized pull-down transistor 8-2 capable of receiving substantial current during the sending of a 0 (GND) in the presence of a highly capacitive load. A capacitive load of this kind is, for example, a data bus connected to the zone P5', having a high parasitic capacity.

Thus, when the integrated circuit 1 sends data on the zone P5, in the presence of a highly capacitive load, the high current that is output during the transmission of a 1 leads to a drop in voltage in the supply wire 11 connecting the zone P2 to the zone P2', and the reduction of the internal supply voltage VCC in relation to the external voltage VCCEXT. Similarly, the high current that is input during the transmission of a 0 causes a drop in voltage in the supply wire 11 connecting the zone P1 to the zone P1', and an increase in the internal ground potential GND in relation to the external ground GNDEXT.

In synchronous data transmissions, the sending of data is generally synchronized with the clock edges, generally the trailing edges, so that a fluctuation of this kind in the internal supply voltage VCC or the ground potential GND occurs simultaneously with the reception of an edge corresponding to a variation of the external clock signal CLKEXT.

FIGS. 2A to 2D illustrate the consequences of a drop in the voltage VCC when a trailing edge is received from the clock signal. FIG. 2A shows the clock signal CLKEXT received on zone P3 at the time of a trailing edge, and FIG. 2D shows a clock signal CLK delivered by the output of the buffer 3. FIG. 2B shows data DTX sent by the zone P5, and FIG. 2C shows the internal supply voltage VCC received by the zone P2. In FIG. 2A, the line of dashes represents the trip point Vt of the inverter gates 4, 5 which is generally equal to VCC/2.

At the instant t0, the clock signal CLKEXT shows a trailing edge and starts diminishing. At an instant t1, the clock signal CLKEXT reaches the trip point of the gates 4, 5 so that the output of the buffer 3 trips, and the clock signal CLK also goes to 0. The passage to 0 of the clock signal CLK activates the sending of data, herein data at 1 (FIG. 2B), and the sending of data prompts a significant drop in the voltage VCC (FIG. 2C).

It follows that the trip point Vt of the gates 4, 5 also drops (FIG. 2A) and becomes lower than the clock signal CLKEXT at an instant t2, so that the gates 4, 5 again trip. The clock signal CLK delivered by the buffer 3 thus goes to 1 whereas it should have stayed at 0. At an instant t3, the supply voltage VCC rises again, the trip point Vt rises and becomes higher than the clock signal CLKEXT, and the clock signal CLK goes back to 0.

Ultimately, after the passage to 0 of the external clock signal CLKEXT, a short-duration parasitic signal appears at the output of the buffer circuit 3. This parasitic signal risks being processed by the integrated circuit as a clock pulse, leading to errors of operation, such as the sending of data before the "true" trailing edge following the external clock signal appears, for example.

In the prior art, there are known ways of avoiding this problem by making input buffers using inverter gates with switching hysteresis, generally inverter Schmitt triggers. Schmitt inverters of this kind have a low-state trip point or tripping threshold Vtl and a high-state tripping threshold Vth that are distinct, the former being lower than the latter.

However, according to observations made by the Applicant, Schmitt inverters cannot totally eliminate the risk of transmission of parasitic signals. This is shown in FIGS. 3A to 3D which show the appearance of the signals of FIGS. 2A to 2D when the input buffer 3 comprises two cascade-mounted Schmitt inverters. It can be seen that a major drop in the supply voltage VCC (FIG. 3C) following the transmission of data at 1 (FIG. 3B) can also cause the high-state trip point Vth of the Schmitt triggers to drop, at the instant t2, below the level of the clock signals CLKEXT (FIG. 3A). Thus, the internal clock signal CLK herein also has a parasitic pulse which disappears at the instant t3 when the low state trip point Vtl of the Schmitt inverters become higher than the external clock signal CLKEXT.

SUMMARY OF THE INVENTION

In view of the foregoing background, an object of the present invention is to provide a buffer circuit that is not sensitive to a drop in the supply voltage taking place after a leading and/or trailing edge of a signal is received at its input.

This and other objects, advantages and features of the present invention are provided by a buffer circuit comprising means for the transfer, to its output, of the logic signal received at its input, with the transfer means comprising at least one logic gate having a trip point sensitive to the supply voltage of the buffer circuit. The buffer circuit further comprises means to deliver an inhibit signal of a determined duration when the logic signal has a trailing edge and/or a leading edge, means for inhibiting the transfer means by insulating the output from the input of the buffer circuit when the inhibit signal is delivered, and storage means for holding at the output of the buffer circuit the logic value that is present therein when the inhibit signal is delivered.

According to one embodiment, the means for delivering the inhibit signal comprises a delay line receiving a reference signal at its input, and a logic gate receiving at a first input the output of the delay line and at a second input the reference signal. The reference signal has the same trailing and/or leading edges as the logic signal. According to another embodiment, the means for delivering the inhibit signal receives a reference signal at its input, with the reference signal being taken at the output of the buffer circuit.

According to yet another embodiment, the transfer means comprises a first inverter gate and a second inverter gate in series, and the inhibiting means comprises a first switch between the two inverter gates. According to another embodiment, the storage means comprises a third inverter gate receiving the output of the second inverter gate at its input, and the output of the third inverter gate is connected to the input of the second inverter gate by a second switch. The first and second switches may be driven by inverter signals so that the first switch is closed when the second switch is open, and vice versa.

According to another embodiment, the buffer circuit comprises means to block the means delivering the buffer circuit inhibit signal.

The present invention also relates to an electronic circuit comprising at least one buffer circuit as defined above, having its input connected to a terminal of the electronic circuit designed to receive a clock signal.

According to one embodiment, the electronic circuit comprises means to send data in synchronization with trailing edges and/or leading edges of the clock signal. According to another embodiment, the electronic circuit comprises a memory array and means for the transmission, in synchronization with trailing and/or leading edges of the clock signal, of data read in the memory array. The buffer circuit inhibit signal may be sent only during periods of data transmission.

BRIEF DESCRIPTION OF THE DRAWINGS

These objects, characteristics and advantages of the invention as well as others shall be explained in greater detail in the following description of an exemplary embodiment of a buffer circuit according to the invention, and two exemplary applications of this buffer circuit, made with reference to the appended figures, of which:

FIG. 1 is a schematic view of an integrated circuit comprising a standard buffer circuit at its input according to the prior art;

FIGS. 2A to 2D show electrical signals appearing in the circuit of FIG. 1, and illustrates the problem to be resolved by the present invention;

FIGS. 3A to 3D represent electrical signals appearing in the circuit of FIG. 1 when the buffer circuit has a switching hysteresis, and illustrates the problem to be resolved according to the present invention;

FIGS. 8A to 8H show electrical signals appearing in the memory of FIG. 7 when the data are delivered therefrom.

DETAILED DESCRIPTION OF THE EMBODIMENTS

Figure 4:
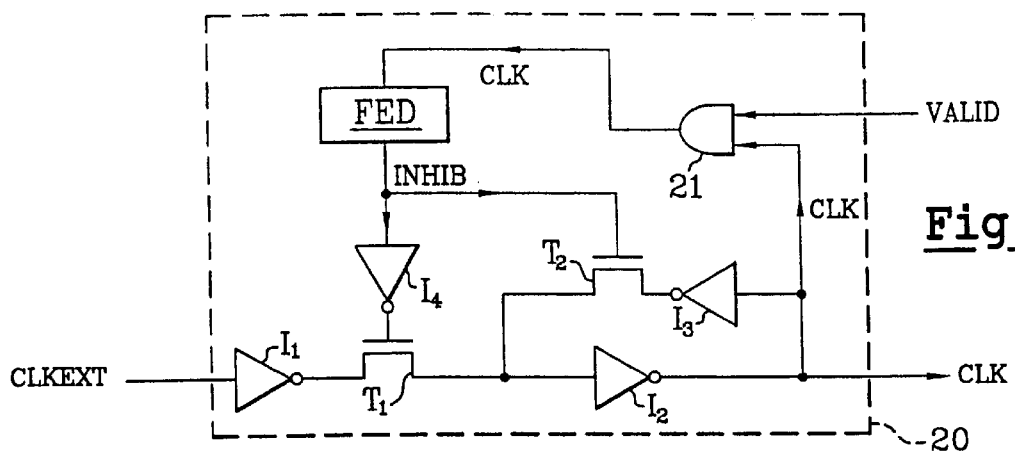
FIG. 4 is an electrical and logic diagram of a buffer circuit according to the present invention.

Referring now to FIG. 4, an exemplary embodiment of a buffer circuit 20 according to the present invention will now be discussed. The circuit 20 conventionally has two cascade-mounted inverter gates I1, I2. The input of the gate I1 receives an external clock signal CLKEXT, and the output of the gate I2 delivers an internal clock signal CLK.

According to the invention, the circuit 20 furthermore has an inhibit switch T1, a storage inverter gate I3 and an edge detector FED. The inhibit switch T1, which herein is a MOS transistor, is between the output of the gate I1 and the input of the gate I2. The storage inverter gate I3 is connected at its input to the output of the gate I2. The output of the gate I3 is connected to the input of the gate I2 by a switch T2, in this case a MOS transistor. The edge detector FED receives, at its input, the signal CLK taken at the output of the buffer circuit 20 and delivers at its output a signal INHIB applied to the gate of the transistor T2. The signal INHIB is also applied to the gate of the transistor T1 by an inverter gate I4. Optionally, the edge detector FED receives the signal CLK by an AND gate 21 receiving the signal CLK at its input and a signal VALID at its input that has to be set at 1 so that the output signal CLK reaches the input of the detector FED.

The detector FED herein is a trailing edge detector designed to set the signal INHIB at 1 when the internal clock signal CLK has its trailing edge. Once set at 1, the signal INHIB is held at 1 for a very short time. This time is smaller than the duration between the trailing edges and the leading edges of the external clock signal CLKEXT.

Figure 5:
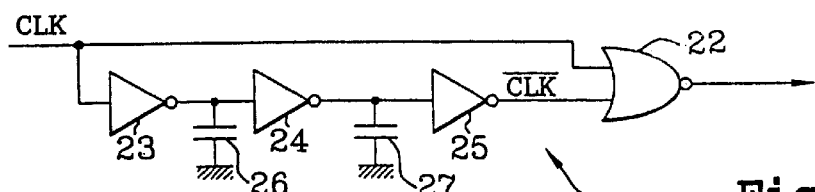
FIG. 5 is an electrical diagram of an element shown in block form in FIG. 4.

As shown in FIG. 5, the detector FED comprises, for example, a NOR gate 22 whose output delivers the signal INHIB. The gate 22 receives, at a first input, the signal CLK and at a second input it receives the output of an inverter delay line. This inverter delay line receives the signal CLK at input and comprises, for example, three cascade-connected inverter gates 23, 24, 25 and two electrical capacitors 26, 27 respectively connected to the output of the gate 23 and the output of the gate 24. When the signal CLK has a stable value equal to 1 or to 0, the signal INHIB is at 0. When the signal CLK goes form 1 to 0 (trailing edge) the gate 22 temporarily receives the value 0 at its two inputs until the capacitor 26 is charged and the capacitor 27 is discharged. During this short period, the signal INHIB is at 1.

Operation of the buffer circuit according to the invention will now be discussed. FIG. 4 shows that the passage to 1 of the signal INHIB has the effect of closing the switch T1 (transistor off) and opening the switch T2 (transistor T2 on). The output of the buffer circuit is then insulated from the input of the buffer circuit because the gate I1 is no longer connected to the gate I2. The value of the signal CLK is held by the gate I3 which, with the gate I2, forms a memory cell that includes two inverter gates laid out back to front. When the signal INHIB goes back to 0, the output of the gate I1 is again connected to the input of the gate I2 and the output of the circuit 20 again copies the signal CLKEXT.

Figure 6A:
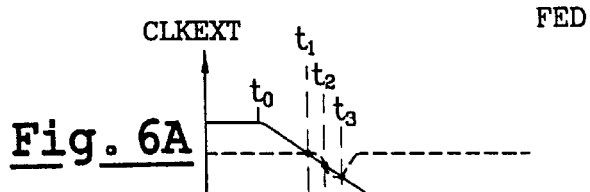
FIGS. 6A to 6E show electrical signals appearing in the circuit of FIG. 1 when the standard buffer circuit is replaced by a buffer circuit according to the present invention.
Figure 6B:
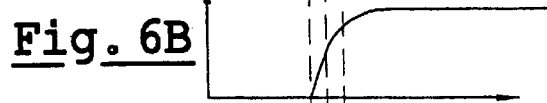
Figure 6C:
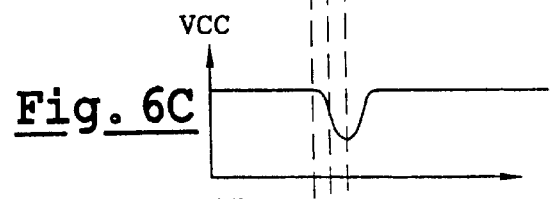
Figure 6D:
Figure 6E:

A first exemplary application will now be discussed. FIGS. 6A to 6E illustrate an application of the buffer circuit 20 to the integrated circuit 1 shown in FIG. 1, as already described in the introduction. It is assumed here that the buffer circuit 20 is laid out different from the standard buffer circuit 3. FIG. 6A shows the signal CLKEXT, and FIG. 6B shows data DTX sent by the output buffer 6 of the integrated circuit 1. FIG. 6C shows the profile of the supply voltage VCC, and FIG. 6D shows the signal INHIB. FIG. 6E shows the internal clock signal CLK delivered by the buffer circuit 20.

At The instant t0, the external clock signal CLKEXT has a trailing edge and starts diminishing. At the instant t1, the signal CLKEXT becomes lower than the trip point Vt of the inverter gates I1, I2 and the internal clock signal CLK goes to 0 (FIG. 6E). The passage to 0 of the internal clock signal CLK causes the sending of data DTX, herein equal to 1 (FIG. 6B).

The sending of data DTX causes a significant drop in the internal supply voltage VCC (FIG. 6C) which itself causes a proportional drop in the trip point Vt of the gates I1, I2. However, the passage to 0 of the signal CLK is detected by the detector FED which sets the signal INHIB at 1 (FIG. 6D), and the buffer circuit 20 goes into a state of inhibition and storage of its output.

Thus, between the instants t2 and t3, the internal clock signal CLK is held at 0 despite the fact that the trip point or trip threshold Vt of the gates I1, I2 is below the level of the clock signal CLKEXT. At the instant t4, the signal INHIB is reset at 0 and the buffer circuit leaves the inhibited state. The duration of transmission of the signal INHIB is equal to (t4-t1) and corresponds to the delay dictated by the delay line of the detector FED.

Figure 7:
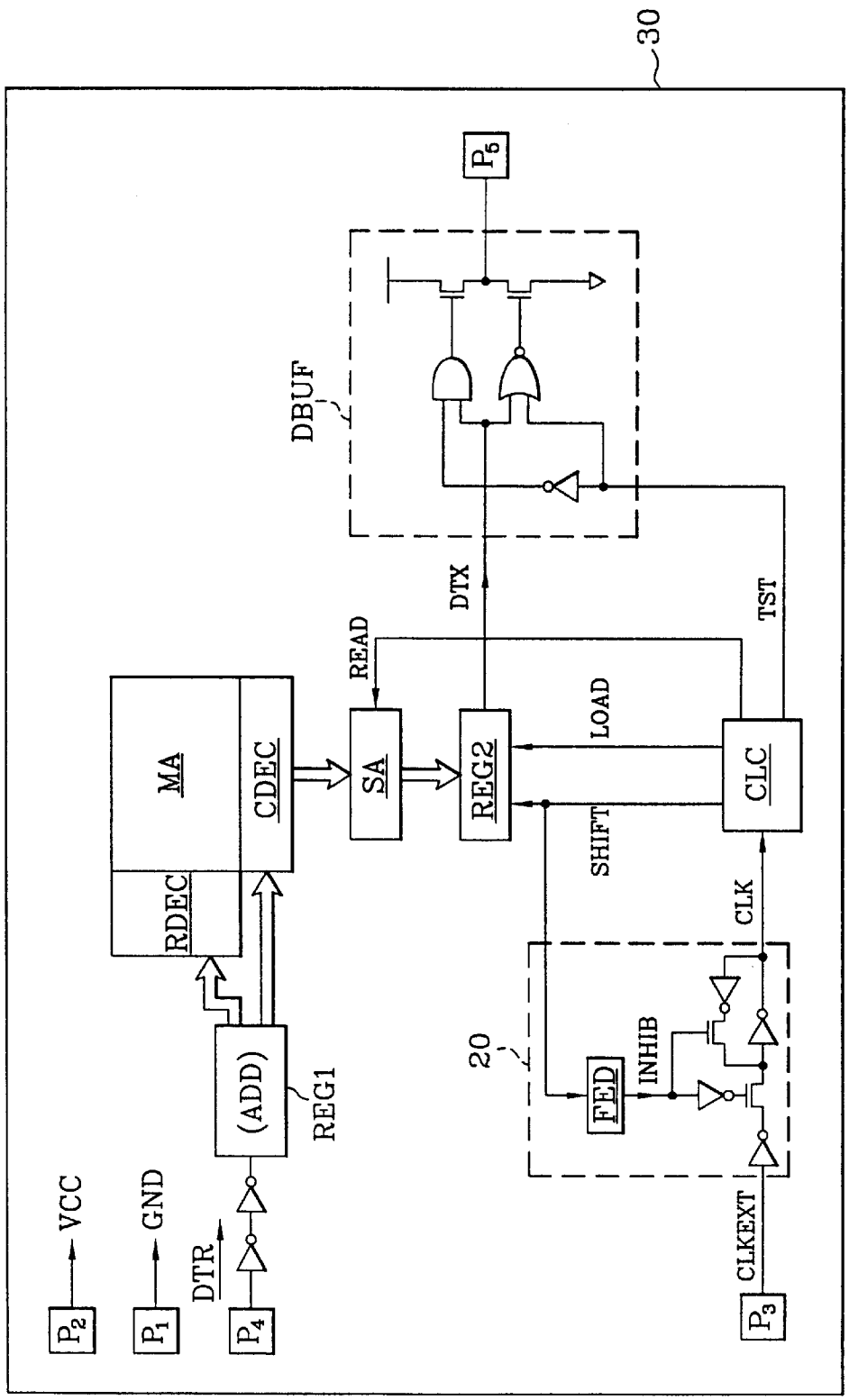
FIG. 7 is a schematic view of an electrically erasable and programmable memory with a serial input/output comprising a buffer circuit according to the present invention.

A second exemplary application will now be discussed with reference to FIG. 7. FIG. 7 illustrates application of the buffer circuit 20 to an electrically erasable and programmable memory 30 with a serial input/output designed to be connected to a data bus having a high parasitic capacitance.

The memory 30 takes the form of an integrated circuit wafer comprising a memory array MA of the EEPROM or FLASH type, wherein the memory cells are laid out in word lines and bit lines. The bit lines are assembled in columns to form binary words, such as bytes, for example. The memory 30 comprises connection zones among which there is a ground GND zone P1, a supply voltage VCC zone P2, a zone P3 for the reception of an external clock signal CLKEXT, a zone P4 for the reception of data DTR and a zone P5 for the sending of data DTX.

The memory 30 also has a column decoder CDEC connected to the bit lines of the memory array MA, a row decoder RDEC connected to the word lines, an input register REG1, a read block SA, an output register REG2 and an output buffer DBUF. The register REG1 is connected at its input to the zone P4 by a standard buffer circuit comprising two inverter gates. The output of the register REG1 respectively sends the decoders RDEC and CDEC the most significant address bits, and the least significant address bits of an address ADD received by the zone P4.

The read block SA is connected at its input to the output of the decoder CDEC. On reception of a read signal READ, the block SA delivers, at a parallel input of the register REG2, the eight bits of an address binary word ADD read in the memory array. The register REG2 receives control signals SHIFT and LOAD and has a serial output delivering serial data DTX formed by the bits of the binary word delivered by the read block SA.

More particularly, the register REG2 carries out a parallel loading of the word delivered by the circuit SA when the signal SHIFT and the signal LOAD are jointly at 1, and they deliver a bit of the binary word on reception of a trailing edge of the signal SHIFT. Finally, the output of the register REG2 is connected to the zone P5 by the output buffer DBUF receiving a control signal TST. The buffer DBUF has two cascade-connected inverter stages. The first stage is laid out to place the output of the second stage in the high impedance state when the signal TST is equal to 1.

These different elements are driven by a logic control circuit CLC which delivers the read signal READ, the signals LOAD and SHIFT as well as the signal TST. The circuit CLC is paced by an internal clock signal CLK delivered by a buffer circuit 20 according to the invention, the input of which is connected to the zone P3. The buffer circuit 20 is identical to the one described above. The only difference is that the detector FED receives the signal SHIFT at its input instead of receiving the signal CLK.

Operation of the memory 30 in a read mode is illustrated by FIGS. 8A to 8H which respectively show the following. FIG. 8A illustrates an internal clock signal CLK delivered by the buffer circuit 20. FIG. 8B illustrates address bits $a_N$, $a_{(N-1)}, \ldots, a2, a1, a0$ received in the zone P4 and stored in the register REG1. FIG. 8C illustrates a read signal READ applied to the block SA. FIG. 8D illustrates the signal SHIFT whose value 1 herein activates the loading of the register REG2 (when the signal LOAD is at 1) and whose passage to 0 activates a shift by one rank of the register REG2 and the sending of a bit to the output of the register. FIG. 8E illustrates the signal INHIB delivered by the detector FED. FIG. 8F illustrates the signal LOAD whose values at 1 permits the loading of the register REG2 by the signal SHIFT. FIG. 8G illustrates bits sent by the output of the register REG2 (data DTX). FIG. 8H illustrates the signal TST for inhibiting the output buffer DBUF.

At an instant t0 corresponding to a leading edge of the clock signal CLK, the last address bit a0 of a read address ADD is received in the register REG1 (FIGS. 8A, 8B) and the signal READ is applied to the read block SA (FIG. 8C). At an instant t2, the output of the read block SA is stabilized and the signal SHIFT is set at 1 (FIG. 8D). Since the signal LOAD is also at 1, the register REG2 carries out a parallel loading of eight bits delivered by the block SA. At an instant t3 corresponding to the first trailing edge of the clock signal CLK (FIG. 8A), the signals LOAD, SHIFT and TST are reset (FIGS. 8D, 8F, 8H). The buffer DBUF is transparent and the register REG2 sends the first bit of a binary word at its output, herein a bit with a place value b7 that is retrieved on the zone P5.

This step of sending a bit through the output buffer DBUF corresponds to the critical period during which the supply voltage VCC may drop. In the prior art, this entails a risk of sending an erroneous clock bit. In this case, however, the passage to 0 of the signal SHIFT activates the edge detector FED which temporarily puts the signal INHIB at 1 (FIG. 8E).

Thus, during the critical period, the buffer circuit 20 according to the invention is inhibited and the internal clock signal CLK is held at 0. During the following clock periods, the signal SHIFT is reset at 1 at each leading edge of the clock signal CLK and is reset at 0 at each trailing edge of the clock signal. Thus, at each trailing edge, the following bits b6, b5, . . . , b0 of the binary word are delivered by the register REG2, and at each delivery of a bit the detector FED puts the signal INHIB at 1.

The reception of the clock signal CLK is therefore entirely secured by the present invention. Outside the period of transmission of output bits, the signal SHIFT remains at 0 and the buffer circuit 20 according to the invention is never inhibited because the detector FED remains inactive.

Alternative embodiments and other applications will now be discussed. The present invention is of course open to several variations, embodiments, and applications. Although, the above description has been devoted to a buffer circuit tripping into an inhibit state upon reception of a trailing edge of the clock signal, it is of course possible to provide for inhibition on a leading edge if data are sent at this instant.

Also, it is possible to provide for a buffer circuit tripping into the inhibit state after each leading edge and each trailing edge of the clock signal. Furthermore, the term "clock signal" is in no way restrictive and may designate any type of logic signal used to activate operations likely to prompt a drop in the supply voltage or an increase in the ground potential of an integrated circuit.

Thus, in certain parallel output memories, the delivery of a binary word is activated by the reception of an address bit. The address signal in this case may be received by a buffer circuit according to the invention. In general, a buffer circuit according to the invention can be used in any type of integrated circuit providing a data transmission in synchronization with the external clock signal.

Finally, although the buffer circuit described above has been made out of inverter gates, which are basic elements of the logic circuit, several variations may be planned by those skilled in the art. In particular, it is possible to use Schmitt inverters instead of the inverter gates or any other logic circuit that can be used to copy the external clock signal CLKEXT.

The detector FED is also capable of having various alternative embodiments. For example, a delay line may be replaced by a timer, for example. Furthermore, in more complex circuits comprising a microprocessor or computation means, the signal INHIB can be generated by the microprocessor itself or by the computation means.

That which is claimed is:

1. An electronic circuit comprising:
 a memory array;
 a buffer circuit connected to said memory array and having an input for receiving a clock signal and an output, said buffer circuit comprising
   transfer means for transferring the clock signal from the input to the output of said buffer circuit, and comprising at least one logic gate connected to the input of said buffer circuit and having a trip point sensitive to a supply voltage of said buffer circuit,
   delivery means for delivering an inhibit signal having a predetermined duration based upon at least one of a trailing edge and a leading edge of the clock signal,
   inhibit means for inhibiting said transfer means and for isolating the output of said buffer circuit from the input of said buffer circuit when the inhibit signal is delivered, and
   storage means for holding a value of the clock signal at the output of said buffer circuit when the inhibit signal is delivered; and
 data transfer means for sending, in synchronization with the at least one of the trailing edge and the leading edge of the clock signal, data read in said memory array.

2. An electronic circuit according to claim 1, wherein said delivery means comprises a delay line receiving a reference signal having the same at least one of the trailing edge and the leading edge as the clock signal; and wherein said at least one logic gate includes a first input for receiving an output signal from said delay line and a second input for receiving the reference signal.

3. An electronic circuit according to claim 2, wherein the reference signal is provided by the output of said buffer circuit.

4. An electronic circuit according to claim 1, wherein said transfer means comprises a first inverter gate and a second inverter gate connected in series; and wherein said inhibit means comprises a first switch connected therebetween.

5. An electronic circuit according to claim 4, wherein said storage means comprises a third inverter gate having an input connected to an output of said second inverter gate; the electronic circuit further comprising a second switch connected between an output of said third inverter gate and an input of said second inverter gate.

6. An electronic circuit according to claim 5, wherein said first and second switches are driven by inverter signals so that said first switch is closed when said second switch is open, and said first switch is open when said second switch is closed.

7. An electronic circuit according to claim 1, further comprising blocking means connected to said delivery means for blocking delivery of the inhibit signal.

8. An electronic circuit according to claim 1, wherein the inhibit signal is sent during periods of data transmission.

9. A memory comprising:
 a memory array;
 a buffer circuit connected to said memory array and having an input for receiving a logic signal and an output, said buffer circuit comprising
   a transfer circuit for transferring the logic signal from the input to the output of said buffer circuit, said transfer circuit comprising at least one logic gate connected to the input of said buffer circuit and having a trip point sensitive to a supply voltage of said buffer circuit,
   a delivery circuit for delivering an inhibit signal having a predetermined duration based upon at least one of a trailing edge and a leading edge of the logic signal,
   an inhibit circuit for inhibiting said transfer circuit and for isolating the output of said buffer circuit from the input of said buffer circuit when the inhibit signal is delivered, and
   a storage circuit for holding a value of the logic signal at the output of said buffer circuit when the inhibit signal is delivered; and
 a data transfer circuit connected to said memory array for sending, in synchronization with the at least one of the trailing edge and the leading edge of the logic signal, data read in said memory array.

10. A memory according to claim 9, wherein said delivery circuit comprises a delay line receiving a reference signal having the same at least one of the trailing edge and the leading edge of the clock signal; and wherein said at least one logic gate includes a first input for receiving an output signal from said delay line and a second input for receiving the reference signal.

11. A memory according to claim 10, wherein the reference signal is provided by the output of said buffer circuit.

12. A memory according to claim 9, wherein said transfer circuit comprises a first inverter gate and a second inverter gate connected in series; and wherein said inhibit circuit comprises a first switch connected therebetween.

13. A memory according to claim 12, wherein said storage circuit comprises a third inverter gate having an input connected to an output of said second inverter gate; the electronic circuit further comprising a second switch connected between an output of said third inverter gate and an input of said second inverter gate.

14. A memory according to claim 13, wherein said first and second switches are driven by inverter signals so that said first switch is closed when said second switch is open, and said first switch is open when said second switch is closed.

15. A memory according to claim 9, further comprising a blocking circuit connected to said delivery circuit for blocking delivery of the inhibit signal.

16. A memory according to claim 9, wherein the inhibit signal is sent during periods of data transmission.

17. A method for transferring data read in a memory comprising a memory array, a buffer circuit connected thereto, and a data transfer circuit connected to the memory array and the buffer circuit, the method comprising:

transferring a logic signal from an input to an output of the buffer circuit using the transfer circuit, the transfer circuit comprising at least one logic gate connected to the input of the buffer circuit and having a trip point sensitive to a supply voltage;

delivering an inhibit signal having a predetermined duration based upon at least one of a trailing edge and a leading edge of the logic signal;

inhibiting the transfer circuit for isolating the output of the buffer circuit from the input of the buffer circuit when the inhibit signal is delivered;

holding a value of the logic signal at the output of the buffer circuit when the inhibit signal is delivered; and sending, in synchronization with the at least one of the trailing edge and the leading edge of the logic signal, data read in the memory array.

18. A method according to claim 17, wherein delivering the inhibit signal is performed using a delay line receiving a reference signal having the same at least one of the trailing edge and the leading edge as the logic signal; and wherein the at least one logic gate includes a first input for receiving an output signal from the delay line and a second input for receiving the reference signal.

19. A method according to claim 18, wherein the reference signal is provided by the output of the buffer circuit.

20. A method according to claim 17, wherein transferring the logic signal is performed using a first inverter gate and a second inverter gate connected in series; and wherein inhibiting the transfer circuit is performed using a first switch connected therebetween.

21. A method according to claim 20, wherein holding the logic value of the logic signal is performed using a third inverter gate having an input connected to an output of the second inverter gate; and the buffer circuit further comprising a second switch connected between an output of the third inverter gate and an input of the second inverter gate.

22. A method according to claim 21, wherein the first and second switches are driven by inverter signals so that the first switch is closed when the second switch is open, and the first switch is open when the second switch is closed.

23. A method according to claim 17, further comprising blocking delivery of the inhibit signal.

* * * * *